United States Patent
Harada et al.

(10) Patent No.: US 8,599,554 B2
(45) Date of Patent: Dec. 3, 2013

(54) POWER CONVERTER

(75) Inventors: Ryotaro Harada, Tokyo (JP); Tetsuya Takahashi, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 217 days.

(21) Appl. No.: 13/318,555

(22) PCT Filed: Jul. 6, 2009

(86) PCT No.: PCT/JP2009/062316
§ 371 (c)(1),
(2), (4) Date: Nov. 2, 2011

(87) PCT Pub. No.: WO2011/004450
PCT Pub. Date: Jan. 13, 2011

(65) Prior Publication Data
US 2012/0044640 A1   Feb. 23, 2012

(51) Int. Cl.
*H05K 7/20* (2006.01)

(52) U.S. Cl.
USPC .................. 361/688; 361/679.47; 361/679.49; 361/695; 361/697; 361/715; 165/80.3; 165/104.33; 165/185; 180/65.1; 180/65.8; 180/68.1; 363/123; 363/132; 363/141; 363/144

(58) Field of Classification Search
USPC ...................... 361/679.46–679.54, 688–697, 361/704–715, 732, 676, 677; 165/80.2, 165/80.3, 104.33, 121–127, 185; 363/89, 363/95–98, 16–20, 131, 132, 123, 127, 141, 363/144, 41, 321; 307/6, 10.1; 318/781, 318/784, 794, 795; 454/184; 180/65.1, 180/65.21, 65.31, 65.8, 68.1
See application file for complete search history.

(56) References Cited

U.S. PATENT DOCUMENTS 4,992,925 A * 2/1991 Meyer .......................... 363/141
5,631,821 A * 5/1997 Muso ........................... 363/141
(Continued)

FOREIGN PATENT DOCUMENTS

| | | |
|---|---|---|
| JP | 3-11924 A | 1/1991 |
| JP | 09-308267 A | 11/1997 |

(Continued)

OTHER PUBLICATIONS

International Search Report (PCT/ISA/210) issued on Oct. 6, 2009, by Japanese Patent Office as the International Searching Authority for International Application No. PCT/JP2009/062316.

(Continued)

*Primary Examiner* — Michail V Datskovskiy
(74) *Attorney, Agent, or Firm* — Buchanan Ingersoll & Rooney PC

(57) ABSTRACT

A power converter is installed in a casing attached beneath the floor of an electric vehicle. The power converter includes a capacitor unit and a power semiconductor module housed in a hermetically sealed part of the casing closed by a cover for closing an access port, and a cooler installed in an exposed part, the cooler cooling heat generated from the power semiconductor module. The power converter includes a bus bar that electrically connects the power semiconductor module and the capacitor unit, and a conductive bar that electrically connects the capacitor unit and the bus bar. The conductive bar is drawn from the upper surface of the capacitor unit, and is bent into a crank.

14 Claims, 5 Drawing Sheets

(56) References Cited

U.S. PATENT DOCUMENTS

| | | | | |
|---|---|---|---|---|
| 6,160,696 A * | 12/2000 | Bailey et al. | ............ | 361/115 |
| 6,188,574 B1 * | 2/2001 | Anazawa | ............ | 361/695 |
| 6,230,509 B1 * | 5/2001 | Yamamoto | ............ | 62/259.2 |
| 6,327,165 B1 * | 12/2001 | Yamane et al. | ............ | 363/132 |
| 6,493,249 B2 * | 12/2002 | Shirakawa et al. | ............ | 363/147 |
| 6,843,335 B2 * | 1/2005 | Shirakawa et al. | ............ | 180/65.1 |
| 7,453,695 B2 * | 11/2008 | Ohnishi et al. | ............ | 361/689 |
| 7,485,983 B2 * | 2/2009 | Asao et al. | ............ | 307/10.1 |
| 7,688,582 B2 * | 3/2010 | Fukazu et al. | ............ | 361/690 |
| 7,692,923 B2 * | 4/2010 | Nakamura et al. | ............ | 361/699 |
| 7,961,487 B2 * | 6/2011 | Seto et al. | ............ | 363/132 |
| 7,978,468 B2 * | 7/2011 | Nakatsu et al. | ............ | 361/689 |
| 8,011,467 B2 * | 9/2011 | Asao et al. | ............ | 180/68.5 |
| 8,416,574 B2 * | 4/2013 | Tokuyama et al. | ............ | 361/699 |
| 2006/0208660 A1 * | 9/2006 | Shinmura et al. | ............ | 315/209 R |

FOREIGN PATENT DOCUMENTS

| | | |
|---|---|---|
| JP | 11-313485 A | 11/1999 |
| JP | 11-332253 A | 11/1999 |
| JP | 2002-262583 A | 9/2002 |
| JP | 2004-312925 A | 11/2004 |
| JP | 2005-65412 A | 3/2005 |
| JP | 2006-46296 A | 2/2006 |
| JP | 2009-100511 A | 5/2009 |

OTHER PUBLICATIONS

Written Opinion (PCT/ISA/237) issued on Oct. 6, 2009, by Japanese Patent Office as the International Searching Authority for International Application No. PCT/JP2009/062316.

Decision of a Patent Grant for corresponding JP 2010-504972, mail date Jun. 22, 2010.

* cited by examiner

POWER CONVERTER

FIELD

The present invention relates to a power converter housed in a casing attached beneath the floor of an electric vehicle, and in particular, to a structure of connecting a power semiconductor module and a capacitor unit through a bus bar.

BACKGROUND

Interconnection between a power semiconductor module and a capacitor unit in a power converter is desirably kept at low inductance. Low inductance may be achieved by means such as a bus bar. Consideration has been given to enhance the productivity of a power converter using a bus bar by simplifying the structure of the bus bar, or by devising the arrangement of a power semiconductor module and a capacitor unit.

A conventional technique disclosed in Patent Literature 1 cited below achieves the lower inductance by using a bus bar of a bent structure that connects a power semiconductor module and a capacitor unit.

A conventional technique disclosed in Patent Literature 2 cited below also achieves the lower inductance by using a plurality of bus bars, or by using a bus bar with no bending that connects a power semiconductor module and a capacitor unit.

CITATION LIST

Patent Literature

Patent Literature 1: Japanese Patent Application Laid-Open No. Hei 11-332253
Patent Literature 2: Japanese Patent Application Laid-Open No. 2005-065412

SUMMARY

Technical Problem

However, the conventional technique disclosed in the above Patent Literature 1 is a mode to place a capacitor unit on the front surface of a power semiconductor, and a terminal of the capacitor unit (conductive bar) on the upper surface of the power semiconductor. This involves use of a bus bar of a bent structure, so that cost increase due to bending of the bus bar is unavoidable.

The conventional technique disclosed in Patent Literature 2 uses a bus bar in the form of a flat plate with no bending, and accordingly it seems to solve the problem of Patent Literature 1. However, the conventional technique of Patent Literature 2 in turn suffers from low performance of maintenance of a capacitor unit and the like. This is described in detail next. A power converter is generally configured in a mode such that a power semiconductor module and a capacitor unit that should be protected from dust are installed in a hermetically sealed part, and a cooler is installed in an exposed part. Desirably, the power semiconductor module and the capacitor unit are arranged especially in consideration of performance of maintenance to be carried out through an access port provided on a side surface of the floor area of a vehicle. However, the conventional technique disclosed in Patent Literature 2 does not give consideration to performance of maintenance through the access port in the power converter in the above mode. Accordingly, in order to remove a bolt that electrically connects a conductive bar and a bus bar, for example, the bolt should be attached and detached in limited space. This means that merely employing a bus bar in the form of a flat plate may degrade performance of maintenance, or may make it impossible to control the tightening torque of a bolt in a power converter in a mode such that units are placed separately in a hermetically sealed part and an exposed part.

The present invention has been made in view of the aforementioned issues. It is an object of the invention to provide a power converter capable of using a bus bar with no bending without degrading performance of maintenance of a casing even if units are placed separately in a hermetically sealed part and an exposed part of the casing.

Solution to Problem

In order to solve the above problem and in order to attain the above object, a power converter according to the present invention is installed in a casing attached beneath the floor of an electric vehicle, and the power converter includes a capacitor unit and a power semiconductor module housed in a hermetically sealed part of the casing closed by a cover for closing an access port, and a cooler installed in an exposed part of the casing. The cooler cools heat generated from the power semiconductor module. The power converter includes: a bus bar that electrically connects the power semiconductor module and the capacitor unit; and a conductive bar that electrically connects the capacitor unit and the bus bar. The conductive bar is drawn from an upper surface of the capacitor unit, and is bent into a crank.

Advantageous Effects of Invention

The present invention uses a conductive bar 3 drawn from the upper surface of a capacitor 6 and bent into a crank. This allows use of a bus bar with no bending without degrading performance of maintenance of a casing even if units are placed separately in a hermetically sealed part and an exposed part of the casing.

DESCRIPTION OF EMBODIMENTS

An embodiment of a power converter according to the present invention will be described in detail below based on the drawings. Note that the embodiment is not intended to limit the invention.

Embodiment

Figure 1:
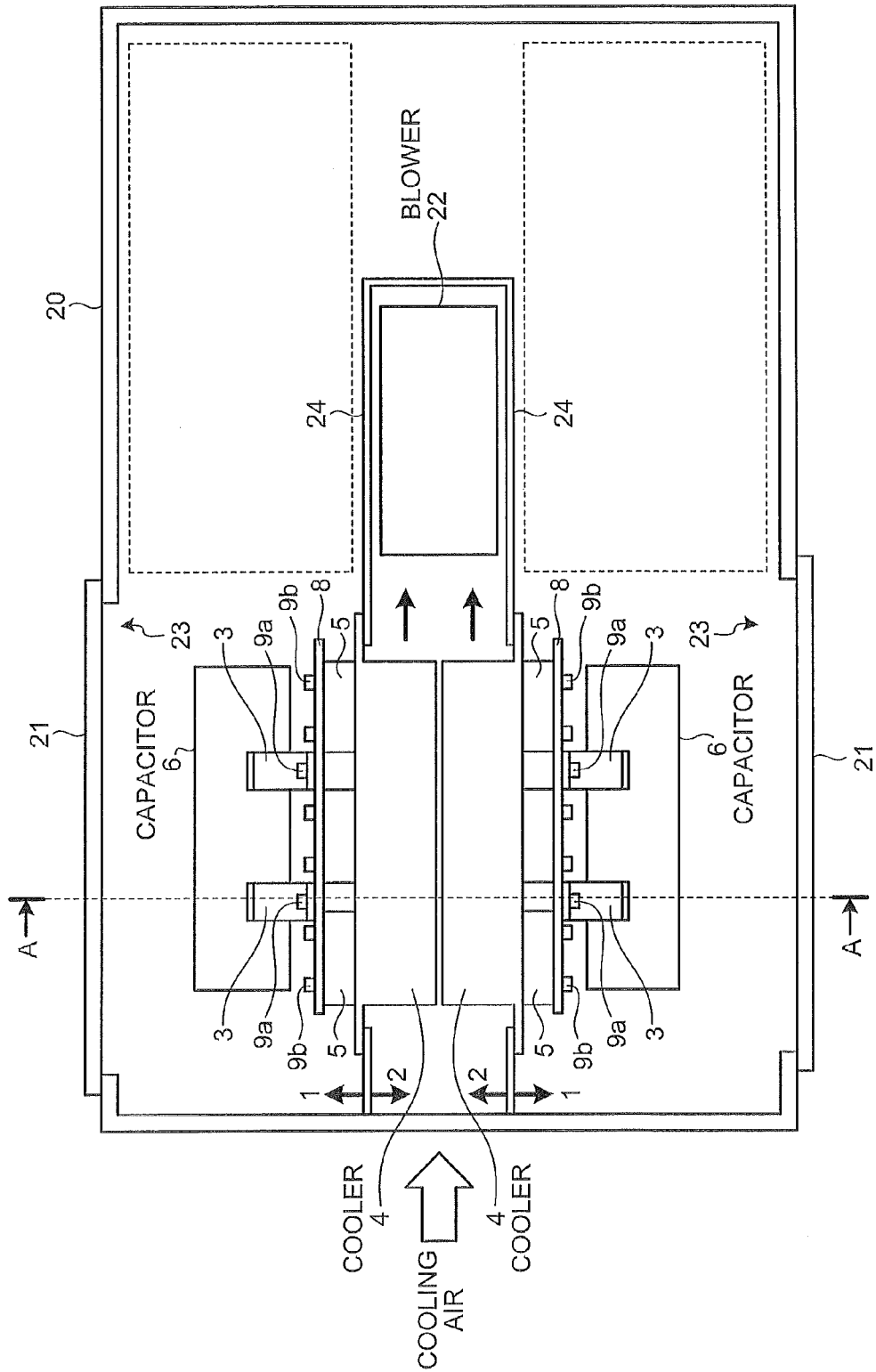
FIG. 1 is a diagram showing the structure of a power converter according to an embodiment of the invention.
Figure 2:
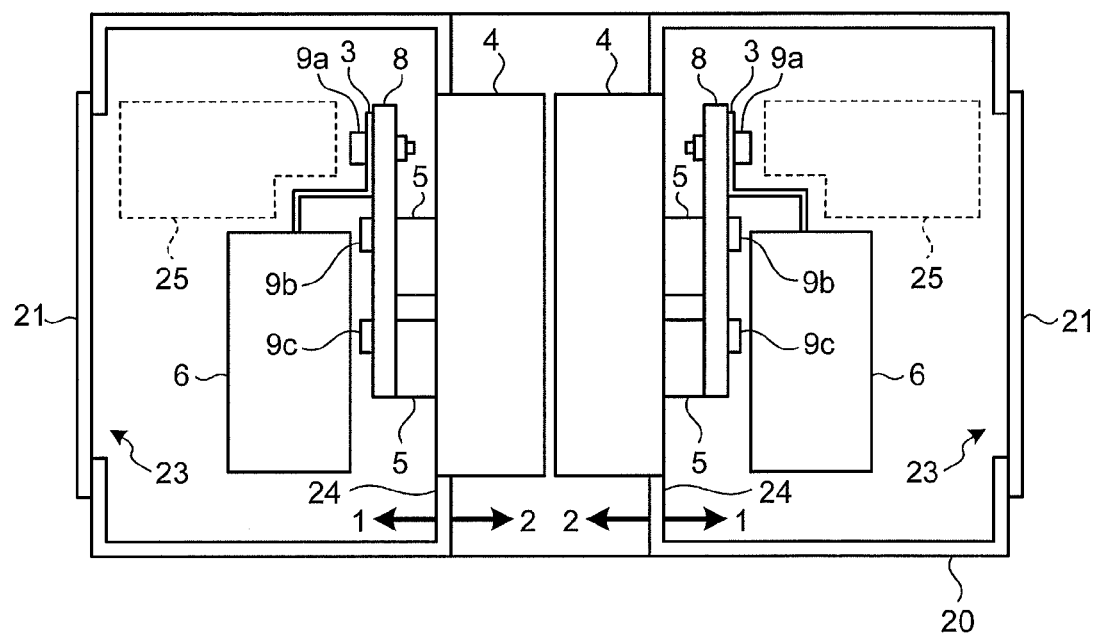
FIG. 2 is a cross sectional view taken along line A-A of FIG. 1.
Figure 3:
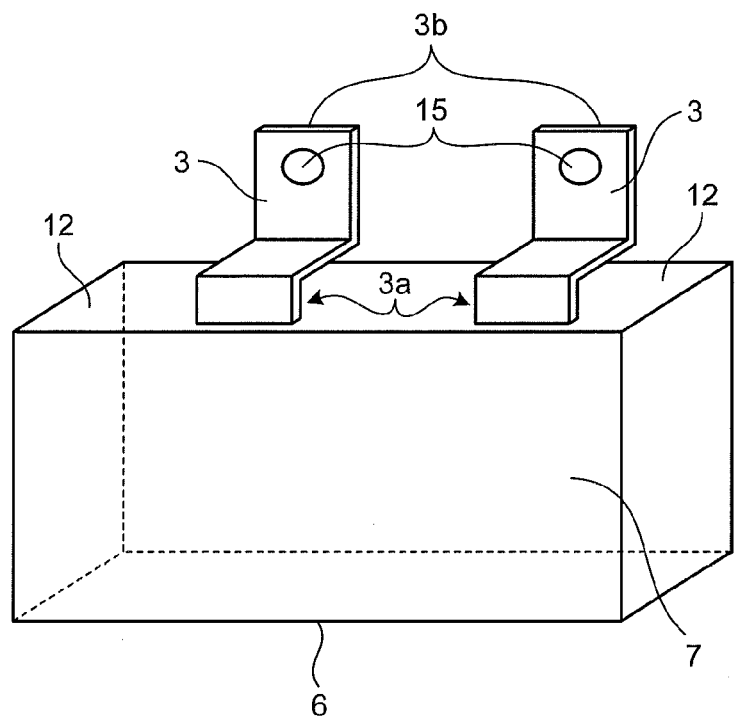
FIG. 3 is a perspective view of a capacitor unit presented to illustrate the structure of a conductive bar according to the embodiment of the invention.
Figure 4:
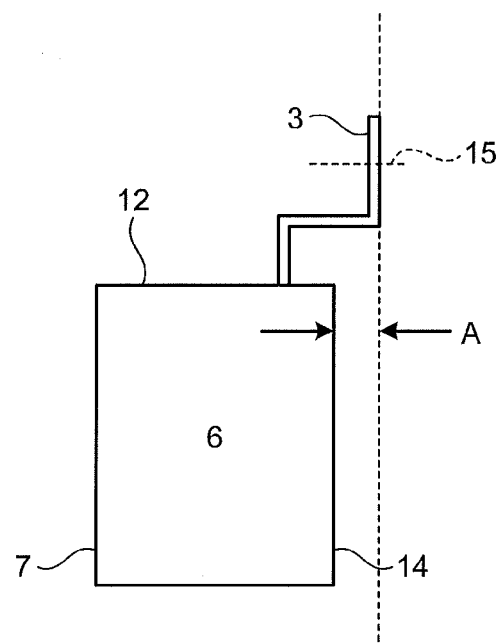
FIG. 4 is a side view of the capacitor unit presented to illustrate the structure of the conductive bar according to the embodiment of the invention.

FIG. 1 is a diagram showing the structure of a power converter according to an embodiment of the invention. FIG. 2 is a cross sectional view taken along line A-A of FIG. 1. FIG. 3 is a perspective view of a capacitor unit presented to illustrate the structure of a conductive bar according to the embodiment of the invention. FIG. 4 is a side view of the capacitor unit presented to illustrate the structure of the conductive bar according to the embodiment of the invention.

As shown in FIG. 1, the main structure of the power converter includes a capacitor unit (hereinafter simply called "capacitor") 6, power semiconductor modules (hereinafter simply called "modules") 5, and a cooler 4. FIG. 1 shows a casing 20 when viewed from above a vehicle down to a track. Specifically, FIG. 1 conceptually shows the structure of the power converter mounted in the casing 20 attached beneath the floor of an electric vehicle.

In an example shown in FIG. 1, two power converters are arranged to face each other through the coolers 4 therebetween. Further, cooling air is introduced through an inlet on the side of the traveling direction of the vehicle, and a cover 21 is attached to sides of the vehicle. As an example, a worker generally follows the flow as follows in order to carry out maintenance of the power converter, especially of the capacitor 6 or the module 5 in the casing 20 shown in FIG. 1. The worker removes the cover 21. Next, the worker removes bolts 9a, and then removes bolts 9b and 9c for fixation of a bus bar 8 to the power semiconductor modules 5 with a certain tool and the like through an access port 23.

A central part of the casing 20 is divided by a partition plate 24 to form an exposed part 2 in which the cooler 4 and a blower 22 are placed. The cooler 4 absorbs heat generated at the modules 5. The blower 22 compulsorily causes dissipation of heat accumulated in the coolers 4 with cooling air introduced from the traveling direction of the vehicle. Air blown off with the blower 22 is discharged, for example, to rails.

A hermetically sealed part 1 houses the modules 5 and the capacitor 6. Terminal surfaces of the modules 5 and the bus bar 8 are electrically connected via the bolts 9b and 9c. Conductive bars 3 and the terminal surfaces of the modules 5 are arranged on the same plane through the bus bar 8. A space in the hermetically sealed part 1 indicated by dotted lines houses different units. Accordingly, the power converter of the invention can make effective use of limited space for housing without interfering with these different units. As shown in FIG. 2, the conductive bar 3 is drawn from the upper surface of the capacitor 6, and is bent into a crank. The conductive bar 3 is drawn from the upper surface of the capacitor 6 while it does not cross a space 25 extending from the access port 23, with the space 25 facing to the connection end between the bus bar 8 and the conductive bar 3. The space 25 is a working space required for attachment and detachment of the bolt 9a from the casing cover 21 side. The bus bar 8 and the conductive bar 3 are connected via the bolt 9a inserted from the access port 23 toward the bus bar 8.

(Shape of Conductive Bar)

The shape of the conductive bars 3 will next be described in detail. As shown in FIG. 3, two conductive bars 3 (+ and − terminals) are provided to the capacitor 6. One end 3a of each conductive bar is drawn, for example, from a capacitor unit's upper surface 12. A bolt passing hole 15 for fixation of the capacitor 6 to the bus bar 8 is formed in the other end 3b of the conductive bar.

Next, as shown in FIG. 4, the conductive bar 3 taken out from the capacitor unit's upper surface (hereinafter simply called "capacitor's upper surface") 12 is bent toward a capacitor unit's back surface (hereinafter simply called "capacitor's back surface") 14 so as to be substantially parallel to the capacitor's upper surface 12. The conductive bar 3 is further bent at a position spaced a predetermined distance (A) from the capacitor unit's back surface 14 in the direction of the capacitor's upper surface 12, namely to extend away from the capacitor 6. The predetermined distance (A) is a distance determined to keep a space for the bolt heads of the bolts 9b and 9c shown in FIG. 2.

The shape of the conductive bar 3 is described next by using FIG. 2. The conductive bar 3 extending from the capacitor 6 is bent toward the bus bar 8. The conductive bar 3 is further bent at a position spaced the predetermined distance (A) from the capacitor 6 so as to extend away from the capacitor 6 and be substantially parallel to the bus bar 8.

Figure 5:
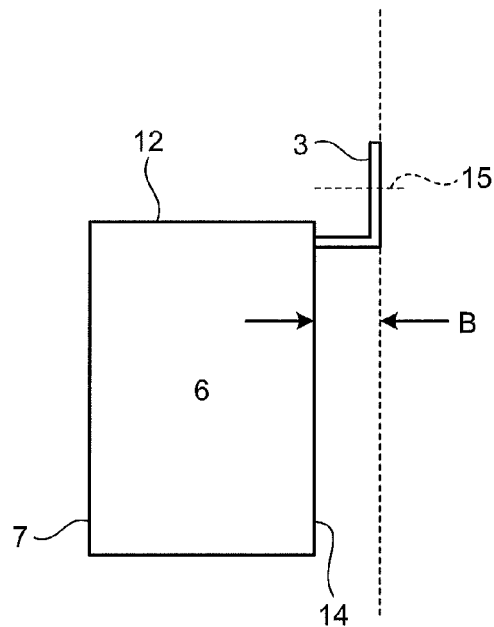
FIG. 5 is a diagram illustrating a problem occurring when a conductive bar is taken out from a back surface of a capacitor unit.

A problem of a conventional technique relating to the shape of the conductive bar 3 will be described next by showing a specific example. FIG. 5 is a diagram illustrating a problem occurring when the conductive bar 3 is taken out from the capacitor's back surface 14. The conductive bar 3 shown in FIG. 5 has a shape employed in the conventional technique. The conductive bar 3 extends toward the capacitor's back surface 14 so as to be substantially parallel to the capacitor's upper surface 12. The conductive bar 3 is bent at a position spaced a predetermined distance (B) from the capacitor's back surface 14 in the direction of the capacitor's upper surface 12 so as to be substantially parallel to the capacitor's back surface 14.

The capacitor 6 mounted on an electric railcar generally has a weight that ranges from some kilograms to some tens of kilograms, so that the thickness of the conductive bar 3 is determined in consideration of mechanical strength. As a result, the bend radius of the conductive bar 3 tends to increase with greater weight of the capacitor 6. If the conductive bar 3 is arranged on the capacitor's back surface 14 as shown in FIG. 5, the predetermined distance (B) of FIG. 5 tends to be made greater than the predetermined distance (A) of FIG. 4 by the weight of the capacitor 6. The predetermined distance (B) cannot be increased without restriction in a power converter if the power converter should achieve space saving in addition to performance of maintenance. Thus, the power converter according to the present embodiment employs the conductive bar 3 of the shape shown in FIG. 4 to achieve performance of maintenance and space saving.

(Bus Bar)

Figure 6:
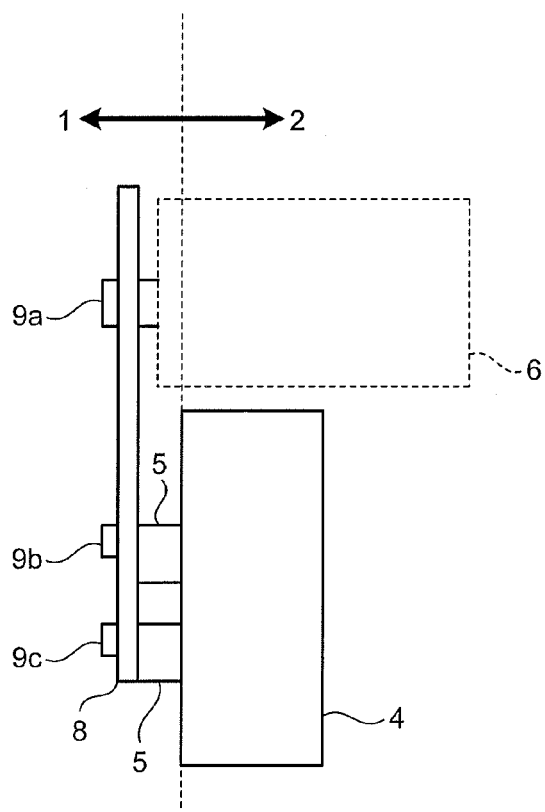
FIG. 6 is a diagram illustrating a problem occurring when a bus bar with no bending is employed.
Figure 7:
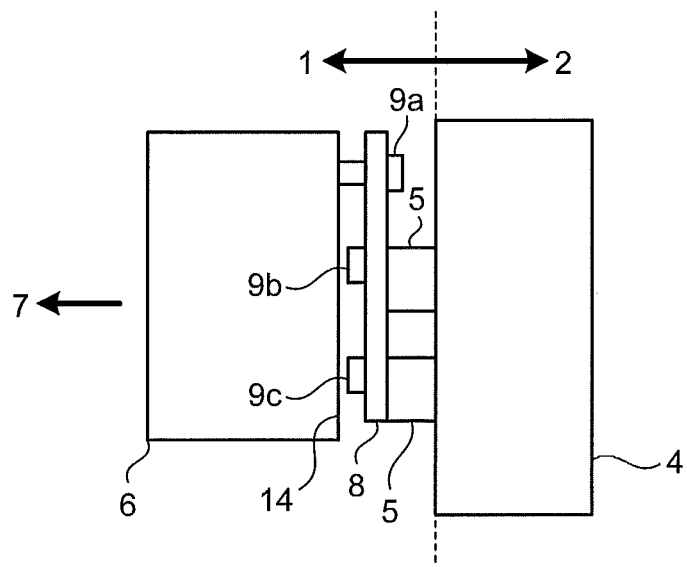
FIG. 7 is a diagram illustrating another problem occurring when a bus bar with no bending is employed.
Figure 8:
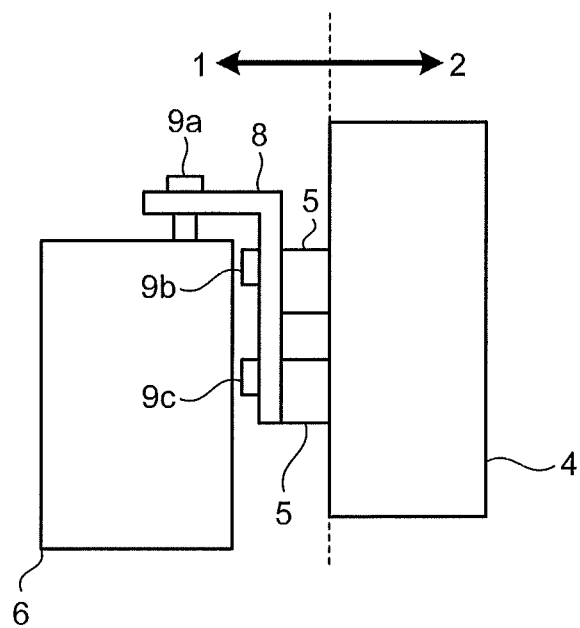
FIG. 8 is a diagram illustrating a problem occurring when a bus bar of a bent structure is employed.

Problems of a conventional technique relating to the shape of the bus bar 8 will be described next by presenting specific examples. FIG. 6 is a diagram illustrating a problem occurring when a bus bar with no bending is employed. FIG. 7 is a diagram illustrating another problem occurring when a bus bar with no bending is employed. FIG. 8 is a diagram illustrating a problem occurring when a bus bar of a bent structure is employed.

The power converter shown in FIG. 6 is in a mode such that the cooler 4 and the capacitor 6 are arranged in the exposed part 2. While using the bus bar 8 with no bending, the above mode of this power converter makes the capacitor 6 requiring protection from dust project into the exposed part 2. The mode of this power converter also places the cooler 4 and the capacitor 6 on the same plane. This makes the positions of the cooler 4 and the capacitor 6 compete against each other, presenting an obstacle to space saving.

The power converter shown in FIG. 7 uses the bus bar 8 with no bending like in FIG. 6, whereas it houses the capacitor 6 in the hermetically sealed part 1. Further, in the mode of this power converter, the bolt 9a is inserted from the capacitor's back surface 14 to fix the capacitor 6 to the bus bar 8. The mode of this power converter makes attachment and detachment of the bolt 9a difficult during check of the capacitor 6 in the direction of a capacitor's front surface 7 (in the direction of the access port 23).

The power converter shown in FIG. 8 employs the bus bar 8 of a bent structure, so that it provides better performance of maintenance than that of FIG. 7. However, as described as the aforementioned problem, the bus bar 8 of a bent structure shown in FIG. 8 increases manufacturing cost compared to a bus bar with no bending.

Meanwhile, in the power converter according to the present embodiment shown in FIGS. 2 to 4, the conductive bar 3 does not cross the space extending from the access port 23, with the space facing to the position at which the bolt 9a is attached (for example, a vicinity around the capacitor's upper surface 12 or the bolt head of the bolt 9a). The conductive bar 3 is drawn from a capacitor's surface which is not a surface of the capacitor 6 facing the bus bar 8 (for example, the capacitor's back surface 14), but which is nearest the connection end between the bus bar 8 and the conductive bar 3 (for example, the capacitor's upper surface 12). As a result, favorable performance of maintenance of the capacitor 6, and cost reduction of the bus bar 8 can be achieved at the same time.

As described above, since the power converter according to the present embodiment uses the conductive bar 3 drawn from the upper surface of the capacitor 6, and which is bent into a crank, it is possible to employ the bus bar 8 with no bending. Thus, manufacturing cost is reduced compared to the bus bar 8 of a bent structure employed in the conventional power converter. A worker can easily attach and detach the bolt 9a through the access port 23 despite the use of the bus bar 8 with no bending. Accordingly, like in the use of a bus bar of a bent structure, favorable performance of maintenance can be achieved by the use of the bust bar 8 with no bending.

The conductive bar 3 shown in FIGS. 2 to 4 has a bent shape substantially at a right angle into a crank in the cross section taken along A-A. Meanwhile, the conductive bar 3 may also be Z-shaped or N-shaped in the cross section along A-A.

Industrial Applicability

As described above, the present invention is applicable to a power converter housed in a casing attached beneath the floor of an electric vehicle, and which includes a cooler installed in an exposed part of the casing, and a power semiconductor module and a capacitor unit installed in a hermetically sealed part of the casing. In particular, the present invention is useful as the invention that allows use of a bus bar with no bending without degrading performance of maintenance.

Reference Signs List 1 hermetically sealed part
2 exposed part
3a one end of conductive bar
3b the other end of conductive bar
4 cooler
5 power semiconductor module
6 capacitor unit
7 capacitor unit's front surface
8 bus bar with no bending
9a, 9b, 9c bolt
12 capacitor unit's upper surface
14 capacitor unit's back surface
15 bolt passing hole
20 casing
21 cover
22 blower
23 access port
24 partition plate
25 space

The invention claimed is:

1. A power converter installed in a casing attached beneath the floor of an electric vehicle, the power converter comprising a capacitor unit and a power semiconductor module housed in a hermetically sealed part of the casing closed by a cover for closing an access port, and a cooler installed in an exposed part of the casing, the cooler cooling heat generated from the power semiconductor module, the power converter comprising:
 a bus bar that electrically connects the power semiconductor module and the capacitor unit;
 a conductive bar that electrically connects the capacitor unit and the bus bar; and
 a bolt inserted from a side of the access port through the bus bar toward the power semiconductor module to be installed between the capacitor unit and the bus bar,
 wherein the conductive bar is drawn from an upper surface of the capacitor unit, extends toward the bus bar by a distance corresponding to a sum of a length from a part from which the capacitor unit is drawn to a surface of the capacitor unit closer to the bolt and a height of a head of the bolt, and is bent into a crank.

2. A power converter installed in a casing attached beneath the floor of an electric vehicle, the power converter comprising a capacitor unit and a power semiconductor module housed in a hermetically sealed part of the casing closed by a cover for closing an access port; and a cooler installed in an exposed part of the casing, the cooler cooling heat generated from the power semiconductor module, the power converter comprising:
 a bus bar that electrically connects the power semiconductor module and the capacitor unit;
 a conductive bar that electrically connects the capacitor unit and the bus bar; and
 a bolt inserted from a side of the access port through the bus bar toward the power semiconductor module to be installed between the capacitor unit and the bus bar,
 wherein the conductive bar is drawn from an upper surface of the capacitor unit, extends toward the bus bar by a distance or more, the distance corresponding to a sum of a length from a part from which the capacitor unit is drawn to a surface of the capacitor unit closer to the bolt and a height of a head of the bolt, and is further bent at a position spaced a predetermined distance from the capacitor unit so as to extend away from the capacitor unit and be substantially parallel to the bus bar.

3. The power converter according to claim 2, wherein as the predetermined distance a space for a head of a bolt for fixation of the bus bar to the power semiconductor module is ensured.

4. The power converter according to claim 2, wherein the conductive bar does not cross a space extending from the access port, with the space facing a connection end between the bus bar and the conductive bar and is drawn from the upper surface of the capacitor unit.

5. The power converter according to claim 2, wherein the bus bar and the conductive bar are connected via a bolt inserted from the access port toward the bus bar.

6. The power converter according to claim 1, wherein the conductive bar does not cross a space extending from the access port, with the space facing a connection end between the bus bar and the conductive bar and is drawn from the upper surface of the capacitor unit.

7. The power converter according to claim 1, wherein the bus bar and the conductive bar are connected via a bolt inserted from the access port toward the bus bar.

8. A power converter installed in a casing attached beneath the floor of an electric vehicle, the power converter comprising a capacitor unit and a power semiconductor module housed in a hermetically sealed part of the casing closed by a cover for closing an access port; and a cooler installed in an exposed part of the casing, the cooler cooling heat generated from the power semiconductor module, the power converter comprising:
a bus bar that electrically connects the power semiconductor module and the capacitor unit;
a pair of conductive bars that electrically connects the power semiconductor module and the capacitor unit in a longitudinal direction of the capacitor unit; and
a bolt inserted from a side of the access port through the bus bar toward the power semiconductor module to be installed between the capacitor unit and the bus bar,
wherein the conductive bars are drawn from an upper surface of the capacitor unit, and extend toward the bus bar by a distance or more, the distance corresponding to a sum of a length from a part from which the capacitor unit is drawn to a surface of the capacitor unit closer to the bolt and a height of a head of the bolt.

9. The power converter according to claim 8, wherein the conductive bar does not cross a space extending from the access port, with the space facing a connection end between the bus bar and the conductive bar and is drawn from the upper surface of the capacitor unit.

10. The power converter according to claim 8, wherein the bus bar and the conductive bar are connected via a bolt inserted from the access port toward the bus bar.

11. The power converter according to claim 3, wherein the conductive bar does not cross a space extending from the access port, with the space facing a connection end between the bus bar and the conductive bar and is drawn from the upper surface of the capacitor unit.

12. The power converter according to claim 3, wherein the bus bar and the conductive bar are connected via a bolt inserted from the access port toward the bus bar.

13. The power converter according to claim 4, wherein the bus bar and the conductive bar are connected via a bolt inserted from the access port toward the bus bar.

14. The power converter according to claim 11, wherein the bus bar and the conductive bar are connected via a bolt inserted from the access port toward the bus bar.

* * * * *